(12) United States Patent
Evans et al.

(10) Patent No.: US 6,649,541 B1
(45) Date of Patent: Nov. 18, 2003

(54) METHOD FOR PREVENTING OR REDUCING DELAMINATION OF DEPOSITED INSULATING LAYERS

(75) Inventors: Allen Lewis Evans, Dripping Springs, TX (US); David E. Brown, Austin, TX (US); Michael J. Satterfield, Round Rock, TX (US); Arturo N. Morosoff, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 148 days.

(21) Appl. No.: 09/920,490

(22) Filed: Aug. 1, 2001

(51) Int. Cl.[7] ............................................. H01L 21/469
(52) U.S. Cl. ..................... 438/791; 438/761; 438/758; 438/787; 438/681
(58) Field of Search ................. 438/758, 761, 438/770, 771, 778, 779, 783, 784, 787, 788, 789, 790, 791, 723, 681

(56) References Cited

U.S. PATENT DOCUMENTS

| | | | |
|---|---|---|---|
| 5,447,887 A | | 9/1995 | Filipiak et al. |
| 6,080,639 A | * | 6/2000 | Huang et al. ................ 438/435 |
| 6,268,274 B1 | * | 7/2001 | Wang et al. ................ 438/597 |
| 6,348,706 B1 | * | 2/2002 | Sandhu ....................... 257/296 |
| 6,376,156 B1 | * | 4/2002 | Cheng et al. ............... 430/314 |
| 6,395,150 B1 | * | 5/2002 | VanCleemput et al. ..................... 204/192.37 |
| 6,458,722 B1 | * | 10/2002 | Kapoor et al. ............. 438/788 |
| 6,479,881 B2 | * | 11/2002 | Wang et al. ................ 257/508 |
| 6,503,818 B1 | * | 1/2003 | Jang ........................... 438/584 |

\* cited by examiner

Primary Examiner—Matthew Smith
Assistant Examiner—Renzo N. Rocchegiani
(74) Attorney, Agent, or Firm—Williams, Morgan & Amerson, P.C.

(57) ABSTRACT

The method disclosed herein provides a semiconducting substrate, positioning the substrate in a high density plasma process chamber, and forming a layer of silicon-rich silicon dioxide above the substrate using a high density plasma process with an oxygen/silane flowrate ratio that is less than or equal to 0.625. In another embodiment, the method provides a semiconducting substrate having a partially formed integrated circuit device formed thereabove, the integrated circuit device having a plurality of conductive interconnections, e.g., conductive lines or conductive plugs, formed thereon, and positioning the substrate in a high density plasma process chamber. The method further includes forming a first layer of silicon dioxide between the plurality of conductive interconnections using a high density plasma process with an oxygen/silane flowrate ratio less than 1.0, and forming a layer of insulating material above the first layer between the conductive interconnections. In another aspect of the present invention, an integrated circuit device has of a plurality of conductive interconnections, e.g., conductive lines, formed above a semiconducting substrate, a layer of silicon dioxide having a silicon content ranging from approximately 50–75 weight percent positioned between the conductive inter-connections, and a layer of insulating material positioned above the layer of silicon dioxide between the conductive interconnections.

44 Claims, 5 Drawing Sheets

METHOD FOR PREVENTING OR REDUCING DELAMINATION OF DEPOSITED INSULATING LAYERS

BACKGROUND OF THE INVENTION

1. Field of the Invention

The present invention is generally directed to the field of semiconductor processing, and, more particularly, to a method of preventing or reducing delamination of insulating layers formed on an integrated circuit device.

2. Description of the Related Art

Many modern integrated circuit devices are very densely packed, i.e., there is very little space between the transistors formed above the substrate. Thus, conductive interconnections used to electrically interconnect the transistors on an integrated circuit device are made in multiple layers to conserve plot space on the semiconducting substrate. By way of background, a portion of an illustrative integrated circuit device 10 formed above a semiconducting substrate 12 is depicted in FIG. 1. The integrated circuit device 10 is comprised of a plurality of transistors 14 formed between shallow trench isolation (STI) regions 15.

The integrated circuit device 10 further comprises a plurality of conductive interconnections, i.e., conductive lines 16 and conductive plugs 18, formed in layers 22, 20, respectively, of insulating material. As is readily apparent to those skilled in the art, the conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc. Within the semiconductor industry, conductive plugs that connect conductive lines are sometimes referred to as "vias," whereas conductive plugs that contact a portion of a transistor are sometimes referred to as "contacts." Thus, the term plug as used herein should be understood to refer to both contacts and vias.

The illustrative transistor 14 shown in FIG. 1 is generally comprised of a gate insulation layer 13, a gate electrode 17, a sidewall spacer 19 positioned adjacent the gate electrode 17, and a plurality of source/drain regions 21. The gate insulation layer 13 may be formed from a variety of materials, such as silicon dioxide. The gate electrode 17 may also be formed from a variety of materials, such as a doped polycrystalline silicon (polysilicon). The source and drain regions 21 may be formed by performing one or more ion implantation processes in which a dopant material is implanted into the substrate 12.

One illustrative process flow for forming the above-referenced structure will now be described with reference to the formation of the conductive lines 16 above the conductive plugs 18 in the insulating layer 20. Initially, a layer of conductive material (not shown), e.g., aluminum, is formed above the surface 23 of the insulating layer 20. Thereafter, the conductive lines 16 are formed by patterning the layer of conductive material using known photolithography and etching processes. Next, a layer of insulating material 22 is formed between the conductive lines 16. This insulating material 22 may be comprised of a variety of materials, such as silicon dioxide, silicon oxynitride, a tri-methyl silicate product known as Black Diamond or 3MS (sold respectively by Applied Materials and Novellus), and it may be formed by a variety of techniques, e.g., high density plasma (HDP) deposition, chemical vapor deposition (CVD), plasma enhanced chemical vapor deposition (PECVD), etc.

Given the very small spacing between the conductive lines 16 in some modem integrated circuit devices, the layer of insulating material 22 may be comprised of silicon dioxide that is formed by an HDP process. Such layers are typically formed using a recipe comprised of oxygen, silane and argon. Thereafter, one or more chemical mechanical polishing (CMP) operations are performed to remove excess amounts of the insulating layer 22 from above the surface 17 of the conductive lines 16. That is, CMP operations are performed until such time as the surface 25 of the insulating layer 22 and the surface 17 of the conductive lines 16 are approximately co-planar.

FIG. 2 is a top view of an illustrative wafer 24. The wafer 24 is comprised of an active region 26 and an edge region 27. A plurality of die 28 are formed in the active region 26 of the wafer 24 above the substrate 12. FIG. 3 is a side view of a portion of the device shown in FIG. 2. Generally, semiconductor devices are manufactured by forming a number of layers or films of material above a semiconductor substrate, such as the insulating layers 20 and 22 described above, and patterning or otherwise processing these layers or films to form the desired electrical devices, e.g., transistors, capacitors, etc. However, there are many irregularities and defects that exist on or near the edge region 27 of the wafer.

For example, problems have arisen in situations when the insulating layers 20, 22 described above are comprised of silicon dioxide formed by an HDP process. In particular, during the formation of the insulating layers 20, 22 between the conductive lines 16, the insulating layers 20, 22 are also formed above the edge region 27 of the wafer 24 where integrated circuit devices are not formed. This edge region 27 of the wafer 24 tends to be problematic in that, since integrated circuit devices are not formed in this region, it is not subjected to the same processing operations as compared to other areas of the wafer 24 where integrated circuit devices are formed. For example, CMP operations focus on proper planarization of the active region 26 of the wafer 24 where devices are formed, and the edge region 27 may only by contacted on an infrequent or irregular basis.

With respect to the situation where the insulating layers 20, 22 are comprised of a silicon dioxide HDP layer as described above, delamination and other defects of the insulating layers 20, 22 on the edge region 27 of the wafer 24 have been observed. More particularly, portions of the insulating layers 20, 22 have tended to spall or pop off and land in the active region 26 of the wafer 24. Such defects can have severe adverse consequences on the device performance. For example, a delaminated flake from a silicon dioxide (HDP) layer may become embedded in a subsequently deposited layer of insulating material. Thereafter, subsequent chemical mechanical polishing operations may rip the flake out of the deposited layer of insulating material, leaving a hole or recess in the layer of insulating material. Subsequent processes performed to form the conductive interconnection for the device, e.g., barrier metal layer deposition, tungsten deposition, and tungsten CMP, may result in a metal, e.g., tungsten, being positioned in the opening or recess in the insulating layer, and such defects may lead to the formation of short circuits in the completed device.

The present invention is directed to a method of solving or at least reducing some or all of the aforementioned problems.

SUMMARY OF THE INVENTION

The present invention is general directed to a method of reducing or preventing delaminations or other defects in layers of insulating materials. In one embodiment, the method comprises forming a layer of silicon dioxide by providing a semiconducting substrate, positioning the substrate in a high density plasma process chamber, and forming a layer of silicon dioxide above the substrate using a high density plasma process comprised of an oxygen/silane flowrate ratio that is less than or equal to 0.625. In other illustrative embodiments, an oxygen/silane flowrate ratio ranging from approximately 0.333–0.625 may be used.

In another illustrative embodiment, the method comprises providing a semiconducting substrate having a partially formed integrated circuit device formed thereabove, the integrated circuit device having a plurality of conductive interconnections, e.g., conductive lines or conductive plugs, formed thereon, and positioning the substrate in a high density plasma process chamber. The method further comprises forming a first layer of silicon dioxide between the plurality of conductive interconnections using a high density plasma process comprised of an oxygen/silane flowrate ratio ranging from approximately 0.333–0.625, and forming a layer of insulating material above the first layer between the conductive interconnections.

In another aspect of the present invention, an integrated circuit device is provided. In one illustrative embodiment, the device is comprised of a plurality of conductive interconnections, e.g., conductive lines, formed above a semiconducting substrate, a layer of silicon dioxide having a silicon content ranging from approximately 50–75 weight percent positioned between the conductive interconnections, and a layer of insulating material positioned above the layer of silicon dioxide between the conductive interconnections.

BRIEF DESCRIPTION OF THE DRAWINGS

The invention may be understood by reference to the following description taken in conjunction with the accompanying drawings, in which like reference numerals identify like elements, and in which.

Figure 1:
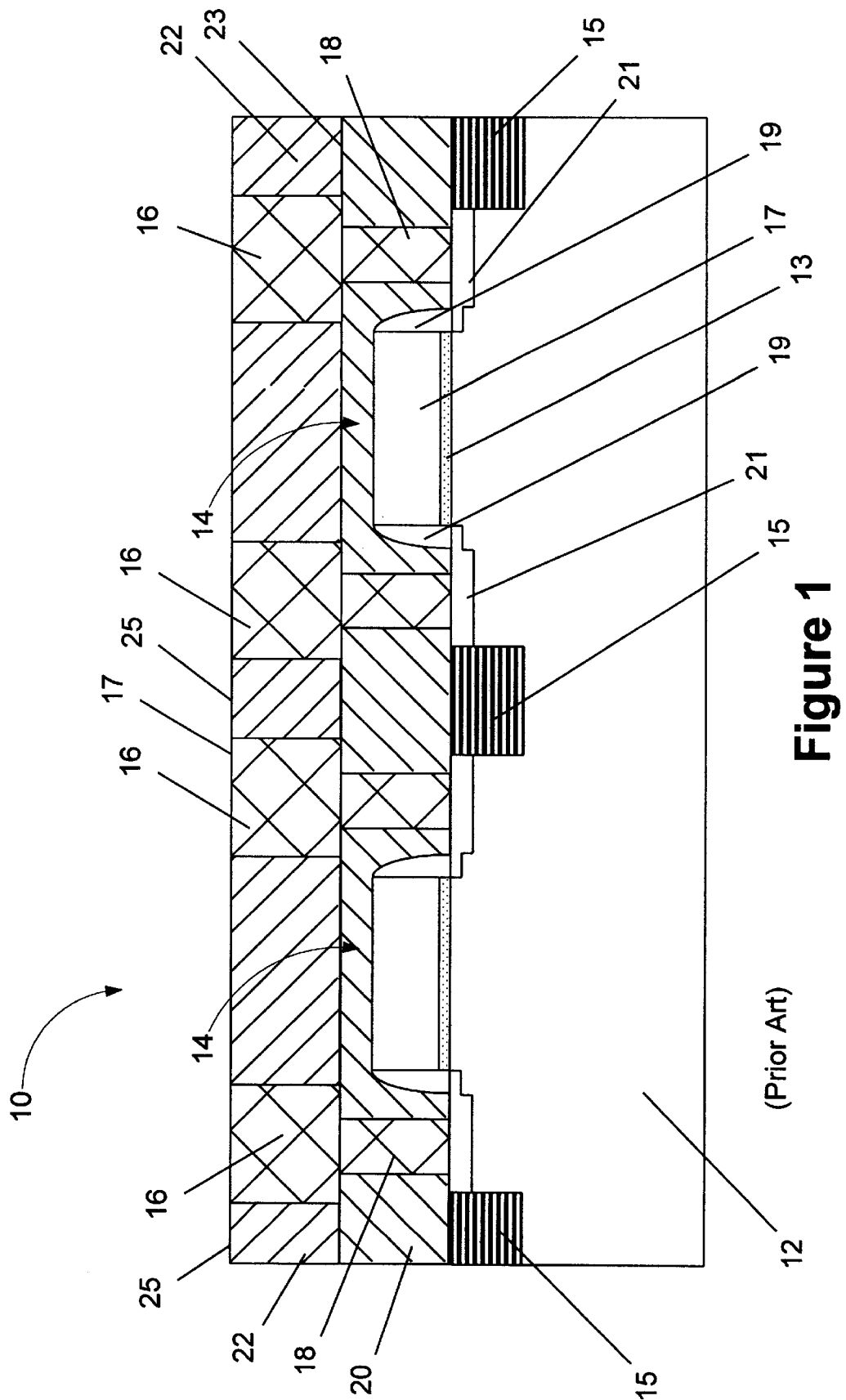
FIG. 1 is a depiction of an illustrative prior device.
Figure 3:
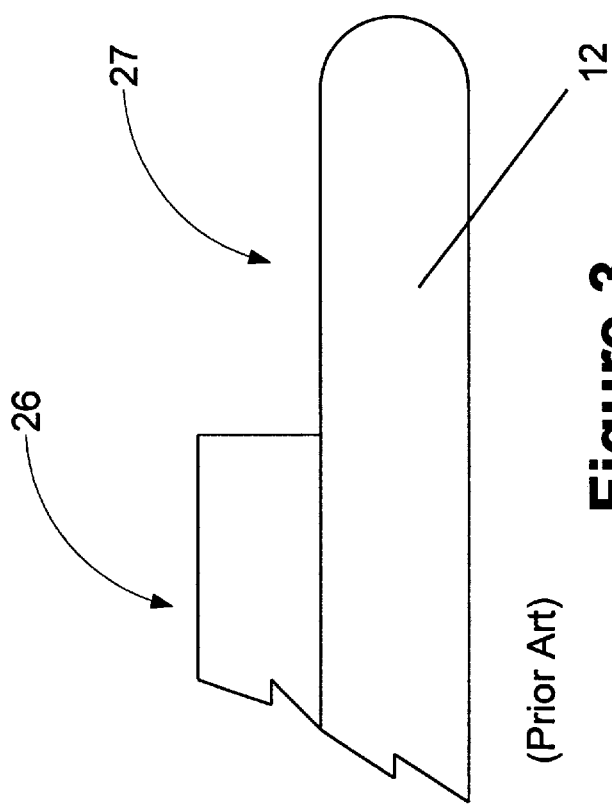
FIG. 3 is a side view of a portion of the substrate shown in FIG. 2.
Figure 2:
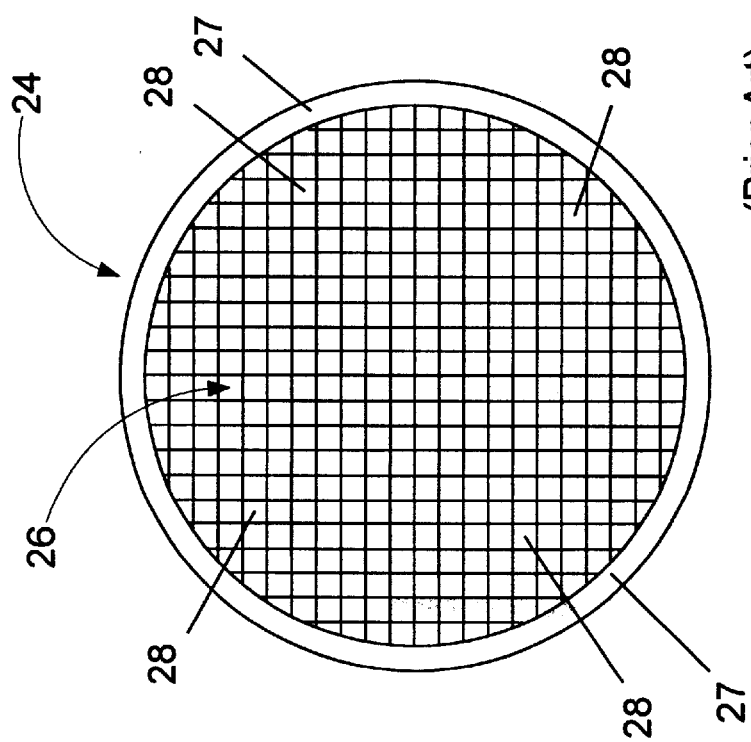
FIG. 2 is a plan view of an illustrative semiconducting substrate having multiple die formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and regions depicted in the drawings may be exaggerated or reduced as compared to the size of those features or regions on fabricated devices. Nevertheless, the attached drawings are included to describe and explain illustrative examples of the present invention.

In general, the present invention is directed to a method of preventing delaminations and other defects in deposited layers of insulating material. More particularly, in one embodiment, the present invention is directed to a method of forming a layer of silicon-rich silicon dioxide. In another embodiment, the present invention is directed to forming a layer of silicon-rich silicon dioxide in the process of forming conductive interconnections on an integrated circuit device. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc. Moreover, the present invention may be used with a variety of combinations of materials for the insulating layers and the conductive materials used to form the conductive interconnections.

As described more fully below, in one illustrative embodiment, the present invention is directed to using a high density plasma process (HDP) to form a layer of silicon dioxide above a semiconducting substrate. In one particular embodiment, the layer of silicon dioxide is rich in silicon, having a silicon content ranging from approximately 50–75 weight percent, and it may have a thickness that ranges from approximately 100–500 Å. Thicker or thinner layers may be formed by increasing or decreasing the duration of the HDP process used to form the layer of silicon dioxide. As those skilled in the art will recognize after a complete reading of the present application, the process disclosed herein may be used to form a layer of silicon dioxide at any stage of manufacturing of an integrated circuit device. In one particularly illustrative embodiment, such a silicon-rich layer of silicon dioxide may be formed using a high density plasma process and appropriate gas flowrates in accordance with the Table I below:

TABLE I

|  | Silicon-rich Silicon Dioxide Layer | Standard Silicon Dioxide Layer |
| --- | --- | --- |
| OXYGEN ($O_2$) | 30–50 sccm | 130–140 sccm |
| SILANE ($SiH_4$) | 80–90 sccm | 80–90 sccm |
| ARGON (Ar) | 250–400 sccm | 380–400 sccm |

The HDP process may be performed at a temperature ranging from approximately 300–380° C. and at a pressure ranging from approximately 3–10 mTorr. The silicon-rich silicon dioxide layer may be formed by introducing the above-described processes gases at the stated flowrates into an HDP process chamber for a time period of approximately 3–4 seconds. This results in the formation of a silicon-rich layer of silicon dioxide having a thickness ranging from approximately 100–500 Å. In one illustrative embodiment, the argon flow rate may range between approximately 250–300 sccm to improve the gap fill properties of the layer. However, it should be understood that aforementioned recipes are illustrative only. For example, inert gases other than argon may be employed in the present invention. Thus, the particular process recipe limitations described herein should not be considered a limitation of the present invention unless such limitations are specifically set forth in the appended claims.

A layer of silicon-rich silicon dioxide formed in accordance with the recipe disclosed herein has several properties worth noting. For example, the silicon-rich silicon dioxide layer has a refractive index ranging from approximately 1.7–2.5 and a silicon content ranging from approximately 50–75 weight percent. This is to be contrasted with a layer of silicon dioxide formed by a traditional HDP process, such as that described above with respect to the standard silicon dioxide layer (see Table I), which has a refractive index of approximately 1.46 and a silicon content ranging from approximately 45–48 weight percent. In one illustrative embodiment of the present invention, the silicon-rich silicon dioxide layer may be formed using an HDP process in which the ratio between the flowrates of oxygen and silane is less than or equal to 0.625. In a more particular embodiment of the present invention, the ratio between the flowrates of oxygen and silane ranges from approximately 0.333–0.625, inclusive. These flowrates are in contrast to the recipe described above for the formation of the standard silicon dioxide layer in which the ratio of the flowrates of oxygen to silane range from approximately 1.444–1.75.

Figure 5A:
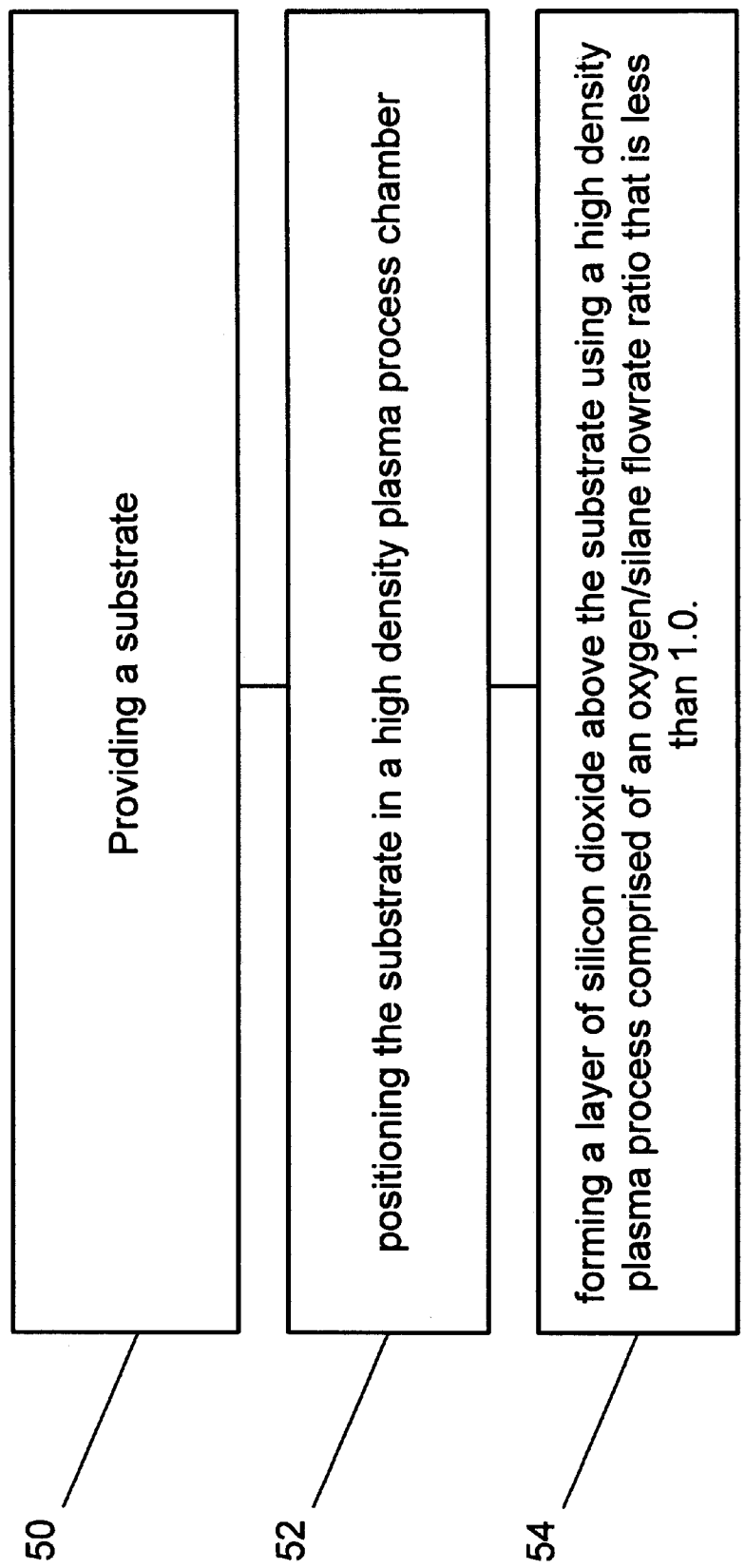
FIGS. 5A–5B are flowcharts depicting illustrative embodiments of the present invention.

FIG. 5A depicts one illustrative embodiment of the method of the present invention in flowchart form. As shown therein, the method comprises providing a semiconducting substrate, as set forth at block 50, positioning the substrate in a high density plasma process chamber, as recited at block 52, and forming a layer of silicon dioxide above the substrate using a high density plasma process comprised of an oxygen/silane flowrate ratio that is less than or equal to 0.625, as described at block 54. As set forth above, this silicon-rich layer of silicon dioxide may be formed at any stage of manufacturing an integrated circuit device.

Figure 4:
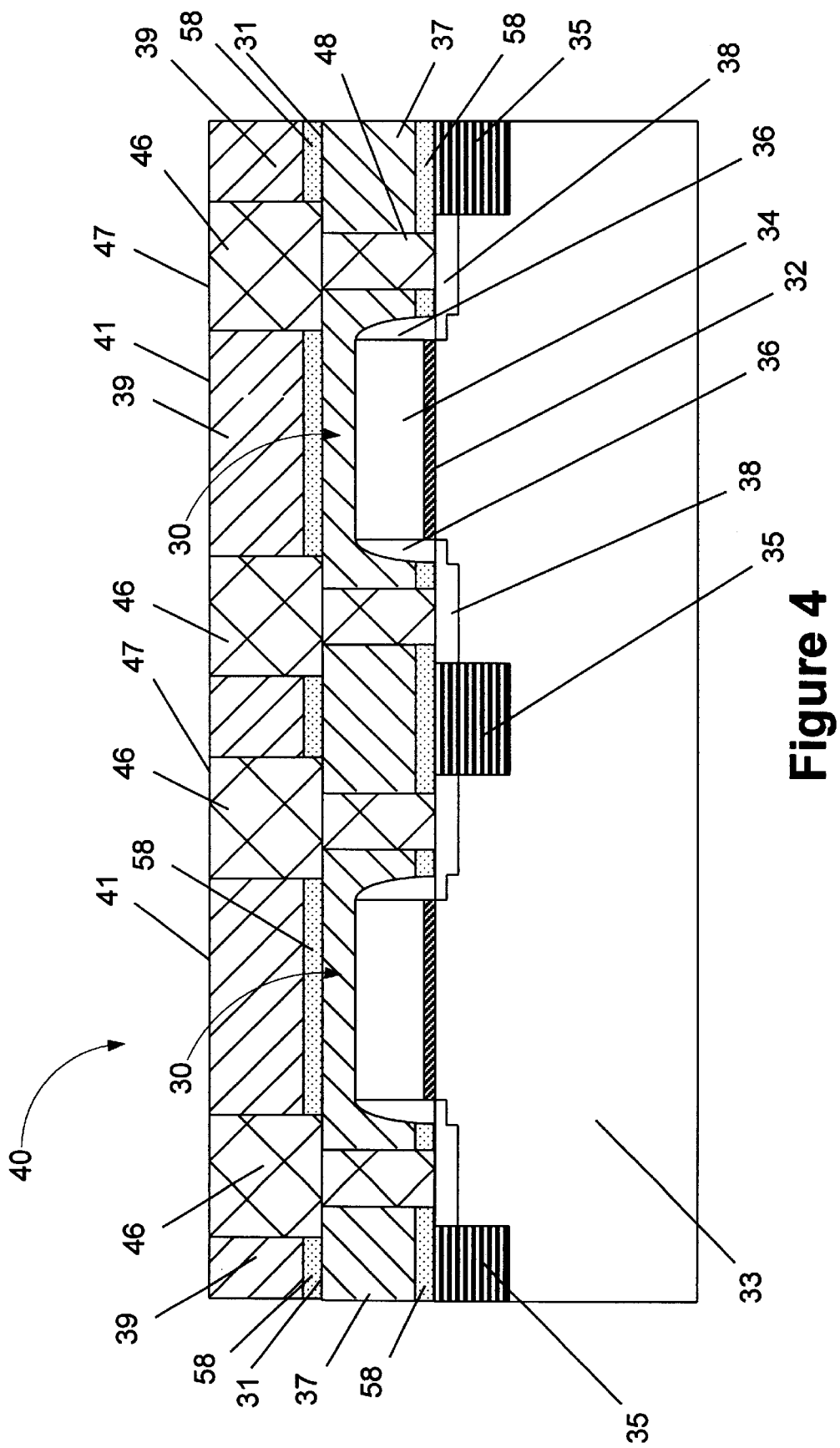
FIG. 4 is an illustrative integrated circuit device in accordance with one illustrative embodiment of the present invention.

FIG. 4 depicts another illustrative embodiment of a method of forming an integrated circuit device 40 in accordance with another embodiment of the present invention. As shown therein, a plurality of transistors 30, having a shallow trench isolation (STI) region 35 positioned therebetween, are formed above a semiconducting substrate 33. In the illustrative embodiment depicted in FIG. 4, the transistors 30 are NMOS transistors. However, those skilled in the art will recognize that the transistors 30 could also be PMOS or CMOS type devices. Each transistor 30 is comprised of a gate insulation layer 32, a gate electrode 34, a sidewall spacer 36, and a plurality of source/drain regions 38. The materials comprising the various components of the transistors 30, as well as the manner in which those components are formed, are well-known to those skilled in the art. For example, the gate insulation layer 32 may be comprised of silicon dioxide, the gate electrode 34 may be comprised of polysilicon, the sidewalls spacer 36 may be comprised of silicon dioxide, and the source/drain regions 38 may be formed by performing one or more ion implantation processes. Thus, the materials of construction for the various components of the illustrative transistors 30 depicted in FIG. 4, as well as the particular processes used to form such components, should not be considered a limitation of the present invention unless specifically set forth in the appended claims.

The device 40 further comprises a silicon-rich layer of silicon dioxide 58 positioned between the conductive lines 46 and plugs 48. In one illustrative embodiment, the silicon-rich layer of silicon dioxide 58 may have a thickness ranging from approximately 100–500 Å, a refractive index ranging from approximately 1.7–2.5, and a silicon content ranging from approximately 50–75 weight percent. The silicon-rich layer of silicon dioxide 58 may be formed in accordance with the novel technique described above.

In this particular embodiment, the formation of the silicon-rich silicon dioxide layer 58 will be discussed in the context of forming it between the adjacent conductive lines 46 shown in FIG. 4. Initially, a layer of conductive material, e.g., aluminum, tungsten, etc., may be deposited over a surface 31 of the underlying insulating layer 37. Thereafter, the conductive lines 46 are formed by performing one or more known photolithography and etching processes.

Then, the silicon-rich silicon dioxide layer 58 and the insulating layer 39 will be formed between the conductive lines 46. One illustrative process flow for achieving this structure will now be described. Initially, the device 40 is placed in an HDP tool, such as an HDP tool sold by Novellus under the trademark Speed. Thereafter, the silicon-rich silicon dioxide layer 58 may be formed between the conductive lines 46 using process gases in accordance with the approximate flowrates indicated in Table I for the silicon-rich layer of silicon dioxide. The insulating layer 39 may be formed in accordance with the flowrates indicated in Table I for the standard layer of silicon dioxide.

Where the silicon-rich dioxide layer 58 and the insulating layer 39 are both formed by an HDP process, they may be formed in accordance with the following process flow. Initially the silicon-rich dioxide layer 58 may be formed by introducing the above-described processes gases at the stated flowrates into an HDP process chamber for a time period of approximately 3–4 seconds. This results in the formation of a silicon-rich layer of silicon dioxide 58 having a thickness ranging from approximately 100–500 Å. Thicker or thinner layers may be formed by increasing or decreasing the duration of the HDP process used to form the silicon-rich silicon dioxide layer 58.

Thereafter, without removing the device 40 from the HDP tool, the oxygen flowrate may be increased to be within the range specified above for the formation of the insulating layer 39, i.e., the oxygen flowrate may be increased to approximately 130–140 sccm. This process may be performed for a time period of approximately 90–140 seconds. This will result in the insulating layer 39 having a thickness ranging from approximately 8,000–10,000 Å. Of course, the thickness of the insulating layer 39 may be varied as a matter of design choice, but it will also be determined, to a great extent, by the height of the conductive lines 46. Normally, the insulating layer 39 will be sufficiently thick that at least a portion of the layer 39 extends above a surface 47 of the conductive lines 46. Thereafter, traditional CMP polishing operations may be performed until a surface 41 of the insulating layer 39 is approximately co-planar with the surface 47 of the conductive lines 46.

However, it should be understood that the insulating layer 39 may be formed of material other than silicon dioxide, and it may be formed by processes other than the HDP process described above. For example, the insulating layer 39 may be comprised of silicon nitride, silicon dioxide (TEOS), silicon dioxide (FTEOS), silicon oxynitride, silicon-rich oxynitride, etc., and it may be formed by a chemical vapor deposition (CVD) process.

As stated above, the silicon-rich silicon dioxide layer 58 formed in accordance with the recipe disclosed herein has several properties worth noting. For example, the silicon-rich dioxide layer 58 has a refractive index ranging from approximately 1.7–2.5 and a silicon content ranging from approximately 50–75 weight percent. Again, this is to be contrasted with a layer of silicon dioxide formed by a traditional HDP process, such as that described above with respect to the insulating layer 39, which has a refractive index of approximately 1.46 and a silicon content ranging from approximately 45–48 weight percent. The silicon-rich silicon dioxide layer 58 may be formed using an HDP process in which the ratio between the flowrates of oxygen and silane is less than or equal to 0.625. In a more particular embodiment of the present invention, the ratio between the flowrates of oxygen and silane ranges from approximately 0.333–0.625. This is in contrast to the recipe described above for the formation of the standard silicon dioxide layer in which the ratio of the flowrates of oxygen to silane range from approximately 1.444–1.75.

Although, in this embodiment, the present invention has been disclosed in the context of forming the silicon-rich layer of silicon dioxide 58 and the insulating layer 39 between the conductive lines 46, the invention should not be considered so limited. That is, those skilled in the art having the benefit of the present disclosure, will recognize that the present invention may be employed at multiple levels on an integrated circuit device. For example, as shown in FIG. 4, a layer of silicon-rich silicon dioxide 58 is formed between the conductive plugs (or contacts) 48 in contact with the source/drain regions 38 of the transistors 40. Thereafter, the insulating layer 37 may be formed using similar techniques and methodologies as those described above with respect to the formation of the insulating layer 39. Thus, the present invention should not be considered as limited to the disclosed embodiment, unless such limitations are specifically set forth in the appended claims.

Figure 5B:
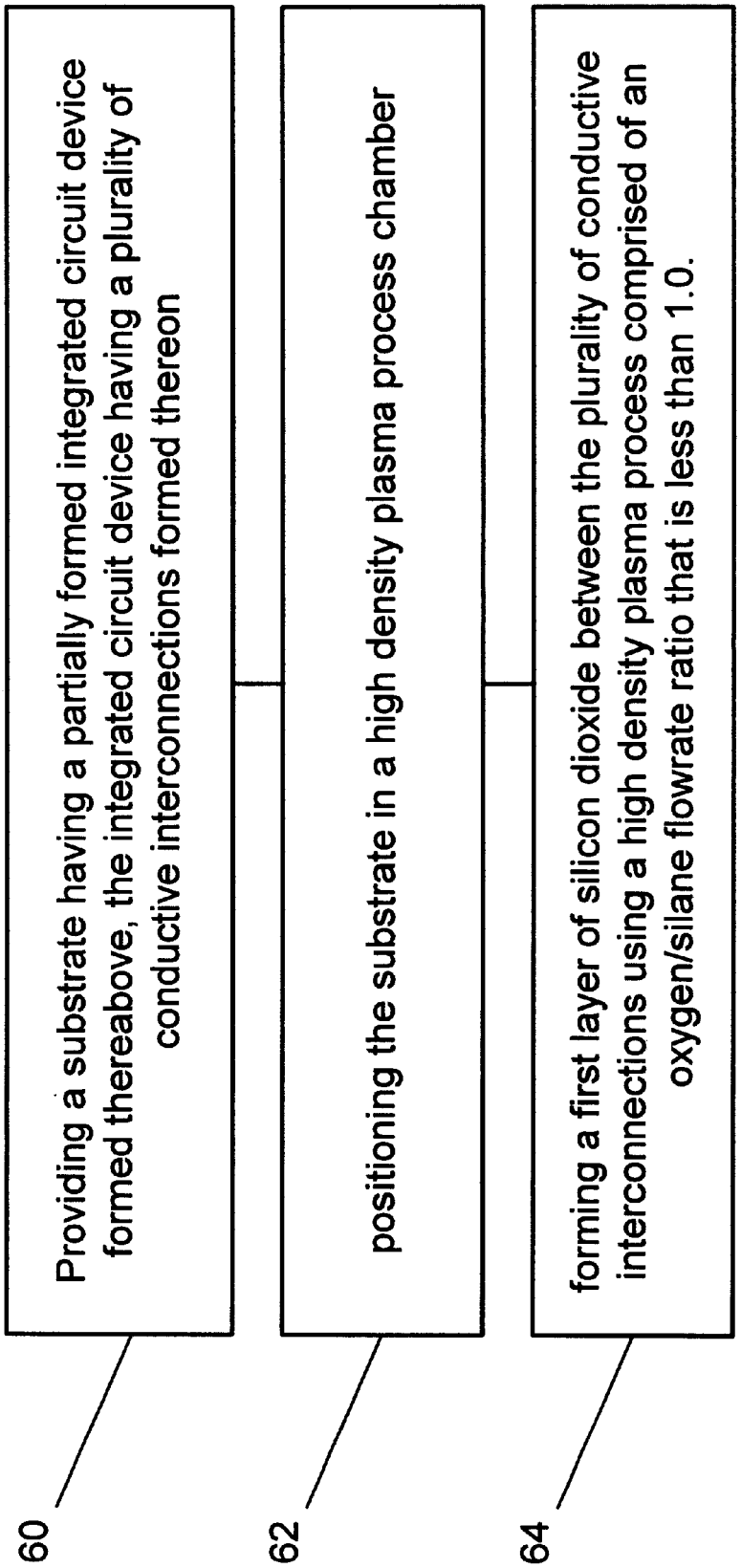

FIG. 5B depicts one illustrative embodiment of the present inventive method in flowchart form. As shown therein, the method comprises providing a semiconducting substrate 33 having a partially formed integrated circuit device 40 formed thereabove, the integrated circuit device 40 having a plurality of conductive interconnections, e.g., conductive lines 46 or conductive plugs 48, formed thereon, as indicated at block 60, and positioning the substrate 33 in a high density plasma (HDP) process chamber, as set forth at block 62. The method further comprises forming a first layer of silicon dioxide between the plurality of conductive interconnections using a high density plasma (HDP) process comprised of an oxygen/silane flowrate ratio is less than or equal to 0.625, as described at block 64. In another illustrative embodiment, the oxygen/silane flowrate ratio ranges from approximately 0.333–0.625. In yet another embodiment, the method further comprises forming a layer of insulating material above the first layer between the plurality of conductive interconnections.

In another aspect of the present invention, an integrated circuit device 40 is provided. In one illustrative embodiment, the device 40 is comprised of a plurality of conductive interconnections, e.g., conductive lines 46, formed above a semiconducting substrate 33, a layer of silicon dioxide 58 having a silicon content ranging from approximately 50–75 weight percent positioned between the conductive interconnections, and a layer of insulating material 39 positioned above the layer of silicon dioxide 58 and between the conductive interconnections.

Through use of the present invention, delamination of insulating layers may be reduced or eliminated, and the problem associated therewith may be reduced or avoided. Formation of a silicon-rich silicon dioxide layer using the recipe described above resulted in a significant reduction in the delamination problems described above. In particular, as compared to a process flow where only the insulating layer 39 is formed between the conductive lines 46, using an HDP process as described above, a reduction of defects of approximately 70–90 percent was observed. In turn, this resulted in fewer potential or actual defects being formed on the edge region 27 of the wafer 24. In turn, this tends to reduce the number of defects in the active region 26 of the wafer 24. As a result, product yields may be increased.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a layer of silicon dioxide, comprising:

providing a semiconducting substrate;

positioning said substrate in a high density plasma process chamber;

forming a layer of silicon dioxide having a thickness ranging from approximately 100–500 Å above said substrate using a high density plasma process comprised of an oxygen/silane flowrate ratio that is less than or equal to 0.625 by introducing oxygen at a flowrate ranging from approximately 30–50 sccm and silane at a flowrate ranging from approximately 80–90 sccm into said high density plasma chamber; and introducing argon into said high density plasma chamber at a flowrate ranging from approximately 250–400 sccm.

2. The method of claim 1, wherein forming a layer of silicon dioxide above said substrate comprises forming a layer of silicon dioxide on said substrate.

3. A method of forming a layer of silicon dioxide, comprising:

providing a semiconducting substrate;

positioning said substrate in a high density plasma process chamber; and forming a layer of silicon dioxide above said substrate using a high density plasma process comprised of an oxygen/silane flowrate ratio ranging from approximately 0.333–0.625 by introducing oxygen at a flowrate ranging from approximately 30–50 sccm and silane at a flowrate ranging from approximately 80–90 sccm into said high density plasma chamber.

4. The method of claim 3, further comprising introducing argon into said high density plasma chamber at a flowrate ranging from approximately 250–400 sccm.

5. The method of claim 3, wherein forming a layer of silicon dioxide above said substrate comprises forming a layer of silicon dioxide on said substrate.

6. A method of forming a layer of silicon dioxide, comprising:
providing a semiconducting substrate;
positioning said substrate in a high density plasma process chamber; and
forming a layer of silicon dioxide above said substrate using a high density plasma process comprised of oxygen at a flowrate ranging from approximately 30–50 sccm and silane at a flowrate ranging from approximately 80–90 sccm into said high density plasma chamber.

7. The method of claim 6, further comprising introducing argon into said high density plasma chamber at a flowrate ranging from approximately 250–400 sccm.

8. The method of claim 6, wherein forming a layer of silicon dioxide above said substrate using a high density plasma process comprises forming a layer of silicon dioxide having a thickness ranging from approximately 100–500 Å above said substrate using a high density plasma process.

9. The method of claim 6, wherein forming a layer of silicon dioxide above said substrate comprises forming a layer of silicon dioxide on said substrate.

10. A method of forming conductive interconnections above a semiconducting substrate, comprising:
providing a semiconducting substrate having a partially-formed integrated circuit device formed thereabove, said integrated circuit device having a plurality of conductive interconnections formed thereon;
positioning said substrate in a high density plasma process chamber; and
forming a first layer of silicon dioxide between said plurality of conductive interconnections using a high density plasma process comprised of an oxygen/silane flowrate ratio that is less than or equal to 0.625 by introducing oxygen at a flowrate ranging from approximately 30–50 sccm and silane at a flowrate ranging from approximately 80–90 sccm into said high density plasma chamber.

11. The method of claim 10, further comprising forming a layer of insulating material above said first layer between said conductive interconnections.

12. The method of claim 11, wherein forming a layer of insulating material above said first layer between said conductive interconnections comprises forming a layer of insulating material comprised of at least one of silicon dioxide, silicon nitride, silicon oxynitride and silicon-rich nitride above said first layer between said conductive interconnections by performing a high density plasma process.

13. The method of claim 11, wherein forming a layer of insulating material above said first layer between said conductive interconnections comprises forming a layer of insulating material comprised of silicon dioxide above said first layer between said conductive interconnections by performing a high density plasma process using oxygen at a flowrate ranging from approximately 130–140 sccm and silane at a flowrate ranging from approximately 80–90 sccm.

14. The method of claim 11, wherein forming a layer of insulating material above said first layer between said conductive interconnections comprises forming a layer of insulating material comprised of silicon dioxide above said first layer between said conductive interconnections by performing a high density plasma process comprised of an oxygen/silane flowrate ratio ranging from approximately 1.444–1.75.

15. The method of claim 10, wherein said plurality of conductive interconnections is comprised of a plurality of conductive lines or plugs.

16. The method of claim 10, further comprising introducing argon into said high density plasma chamber at a flowrate ranging from approximately 250–400 sccm.

17. The method of claim 10, wherein a said first layer of silicon dioxide has a thickness ranging from approximately 100–500 Å.

18. The method of claim 10, further comprising performing at least one chemical mechanical polishing operation to planarize an upper surface of said insulating layer with an upper surface of at least some of said plurality of conductive interconnections.

19. A method of forming conductive interconnections above a semiconducting substrate, comprising:
providing a semiconducting substrate having a partially-formed integrated circuit device formed thereabove, said integrated circuit device having a plurality of conductive interconnections formed thereon;
positioning said substrate in a high density plasma process chamber;
forming a first layer of silicon dioxide between said plurality of conductive interconnections using a high density plasma process comprised of an oxygen/silane flowrate ratio ranging from approximately 0.333–0.625 by introducing oxygen at a flowrate ranging from approximately 30–50 sccm and silane at a flowrate ranging from approximately 80–90 sccm into said high density plasma chamber; and
forming a layer of insulating material above said first layer between said conductive interconnections.

20. The method of claim 19, wherein said plurality of conductive interconnections is comprised of a plurality of conductive lines or plugs.

21. The method of claim 19, further comprising introducing argon into said high density plasma chamber at a flowrate ranging from approximately 250–400 sccm.

22. The method of claim 19, wherein a said first layer of silicon dioxide has a thickness ranging from approximately 100–500 Å.

23. The method of claim 19, wherein forming a layer of insulating material above said first layer between said conductive interconnections comprises forming a layer of insulating material comprised of at least one of silicon dioxide, silicon nitride, silicon oxynitride and silicon-rich nitride above said first layer between said conductive interconnections by performing a high density plasma process.

24. The method of claim 19, wherein forming a layer of insulating material above said first layer between said conductive interconnections comprises forming a layer of insulating material comprised of silicon dioxide above said first layer between said conductive interconnections by performing a high density plasma process using oxygen at a flowrate ranging from approximately 130–140 sccm and silane at a flowrate ranging from approximately 80–90 sccm.

25. The method of claim 19, wherein forming a layer of insulating material above said first layer between said conductive interconnections comprises forming a layer of insulating material comprised of silicon dioxide above said first layer between said conductive interconnections by performing a high density plasma process comprised of an oxygen/silane flowrate ratio ranging from approximately 1.444–1.75.

26. The method of claim 19, further comprising performing at least one chemical mechanical polishing operation to planarize an upper surface of said insulating layer with an upper surface of at least some of said plurality of conductive interconnections.

27. A method of forming conductive interconnections above a semiconducting substrate, comprising:

providing a semiconducting substrate having a partially-formed integrated circuit device formed thereabove, said integrated circuit device having a plurality of conductive interconnections formed thereon;

positioning said substrate in a high density plasma process chamber;

forming a first layer of silicon dioxide between said plurality of conductive interconnections using a high density plasma process comprised of an oxygen/silane flowrate ratio ranging from approximately 0.333–0.625; and forming a layer of insulating material comprised of silicon dioxide above said first layer between said conductive interconnections by performing a high density plasma process comprised of an oxygen/silane flowrate ratio ranging from approximately 1.444–1.75.

28. The method of claim 27, wherein said plurality of conductive interconnections is comprised of a plurality of conductive lines or plugs.

29. The method of claim 27, wherein forming a first layer of silicon dioxide between said plurality of conductive interconnections using a high density plasma process comprised of an oxygen/silane flowrate ratio ranging from approximately 0.333–0.625 comprises introducing oxygen at a flowrate ranging from approximately 30–50 sccm and silane at a flowrate ranging from approximately 80–90 sccm into said high density plasma chamber.

30. The method of claim 29, further comprising introducing argon into said high density plasma chamber at a flowrate ranging from approximately 250–400 sccm.

31. The method of claim 27, wherein said first layer of silicon dioxide has a thickness ranging from approximately 100–500 Å.

32. The method of claim 27, wherein forming a layer of insulating material comprised of silicon dioxide above said first layer between said conductive interconnections by performing a high density plasma process comprised of an oxygen/silane flowrate ratio ranging from approximately 1.444–1.75 comprises forming a layer of insulating material comprised of silicon dioxide above said first layer between said conductive interconnections by performing a high density plasma process using oxygen at a flowrate ranging from approximately 130–140 sccm and silane at a flowrate ranging from approximately 80–90 sccm.

33. The method of claim 27, further comprising performing at least one chemical mechanical polishing operation to planarize an upper surface of said insulating layer with an upper surface of at least some of said plurality of conductive interconnections.

34. A method of forming conductive interconnections above a semiconducting substrate, comprising:

providing a semiconducting substrate having a partially-formed integrated circuit device formed thereabove, said integrated circuit device having a plurality of conductive interconnections formed thereon;

positioning said substrate in a high density plasma process chamber;

forming a first layer of silicon dioxide between said plurality of conductive interconnections using a high density plasma process and introducing oxygen at a flowrate ranging from approximately 30–50 sccm and silane at a flowrate ranging from approximately 80–90 sccm into said high density plasma chamber; and forming a layer of insulating material above said first layer between said conductive interconnections.

35. The method of claim 34, wherein said plurality of conductive interconnections is comprised of a plurality of conductive lines or plugs.

36. The method of claim 34, further comprising introducing argon into said high density plasma chamber at a flowrate ranging from approximately 250–400 sccm.

37. The method of claim 34, wherein forming a the first layer of silicon dioxide between said plurality of conductive interconnections using a high density plasma process comprises forming a first layer of silicon dioxide having a thickness ranging from approximately 100–500 Å between said plurality of conductive interconnections using a high density plasma process.

38. The method of claim 34, wherein forming a layer of insulating material above said first layer between said conductive interconnections comprises forming a layer of insulating material comprised of at least one of silicon dioxide, silicon nitride, silicon oxynitride and silicon-rich nitride above said first layer between said conductive interconnections by performing a high density plasma process.

39. The method of claim 34, wherein forming a layer of insulating material above said first layer between said conductive interconnections comprises forming a layer of insulating material above said first layer between said conductive interconnections by performing a high density plasma process using oxygen at a flowrate ranging from approximately 130–140 sccm and silane at a flowrate ranging from approximately 80–90 sccm.

40. The method of claim 34, further comprising performing at least one chemical mechanical polishing operation to planarize an upper surface of said insulating layer with an upper surface of at least some of said plurality of conductive interconnections.

41. A method of forming conductive interconnections above a semiconducting substrate, comprising:

providing a semiconducting substrate having a partially-formed integrated circuit device formed thereabove, said integrated circuit device having a plurality of conductive interconnections formed thereon;

positioning said substrate in a high density plasma process chamber;

forming a first layer of silicon dioxide between said plurality of conductive interconnections using a high density plasma process comprised of an oxygen/silane flowrate ratio that is less than or equal to 0.625; and forming a layer of insulating material comprised of silicon dioxide above said first layer between said conductive interconnections by performing a high density plasma process using oxygen at a flowrate ranging from approximately 130–140 sccm and silane at a flowrate ranging from approximately 80–90 sccm.

42. A method of forming conductive interconnections above a semiconducting substrate, comprising:

providing a semiconducting substrate having a partially-formed integrated circuit device formed thereabove, said integrated circuit device having a plurality of conductive interconnections formed thereon;

positioning said substrate in a high density plasma process chamber;

forming a first layer of silicon dioxide between said plurality of conductive interconnections using a high density plasma process comprised of an oxygen/silane flowrate ratio that is less than or equal to 0.625; and forming a layer of insulating material comprised of silicon dioxide above said first layer between said conductive interconnections by performing a high density plasma process comprised of an oxygen/silane flowrate ratio ranging from approximately 1.444–1.75.

43. A method of forming conductive interconnections above a semiconducting substrate, comprising:

providing a semiconducting substrate having a partially-formed integrated circuit device formed thereabove, said integrated circuit device having a plurality of conductive interconnections formed thereon;

positioning said substrate in a high density plasma process chamber;

forming a first layer of silicon dioxide between said plurality of conductive interconnections using a high density plasma process comprised of an oxygen/silane flowrate ratio ranging from approximately 0.333–0.625;

forming a layer of insulating material above said first layer between said conductive interconnections; and forming a layer of insulating material comprised of silicon dioxide above said first layer between said conductive interconnections by performing a high density plasma process using oxygen at a flowrate ranging from approximately 130–140 sccm and silane at a flowrate ranging from approximately 80–90 sccm.

44. A method of forming conductive interconnections above a semiconducting substrate, comprising:

providing a semiconducting substrate having a partially-formed integrated circuit device formed thereabove, said integrated circuit device having a plurality of conductive interconnections formed thereon;

positioning said substrate in a high density plasma process chamber;

forming a first layer of silicon dioxide between said plurality of conductive interconnections using a high density plasma process comprised of an oxygen/silane flowrate ratio ranging from approximately 0.333–0.625;

forming a layer of insulating material above said first layer between said conductive interconnections; and forming a layer of insulating material comprised of silicon dioxide above said first layer between said conductive interconnections by performing a high density plasma process comprised of an oxygen/silane flowrate ratio ranging from approximately 1.444–1.75.

* * * * *